United States Patent
Rajendran

(10) Patent No.: US 8,956,557 B2
(45) Date of Patent: Feb. 17, 2015

(54) THICK FILM SILVER PASTE CONTAINING COPPER AND LEAD—TELLURIUM—OXIDE AND ITS USE IN THE MANUFACTURE OF SEMICONDUCTOR DEVICES

(71) Applicant: E I du Pont de Nemours and Company, Wilmington, DE (US)

(72) Inventor: Raj G. Rajendran, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 203 days.

(21) Appl. No.: 13/735,602

(22) Filed: Jan. 7, 2013

(65) Prior Publication Data

US 2013/0187101 A1 Jul. 25, 2013

Related U.S. Application Data

(60) Provisional application No. 61/589,895, filed on Jan. 24, 2012.

(51) Int. Cl.
- *H01B 1/16* (2006.01)
- *H01B 1/22* (2006.01)
- *H01L 31/0224* (2006.01)
- *H01L 31/068* (2012.01)

(52) U.S. Cl.
CPC .............. *H01L 31/0224* (2013.01); *H01B 1/22* (2013.01); *H01L 31/022425* (2013.01); *H01L 31/068* (2013.01); *Y02E 10/50* (2013.01)

USPC .......................................... 252/514; 136/252

(58) Field of Classification Search
CPC .............. H01B 1/22; C03C 3/00; C03C 4/14; C03C 12/00; C03C 14/006; H01L 31/0224; H01L 35/14–35/24; C09D 5/24; C08K 2201/001; H05K 1/0296; H05K 1/092
USPC ................... 252/514; 136/252–256
See application file for complete search history.

(56) References Cited

U.S. PATENT DOCUMENTS

| | | | | |
|---|---|---|---|---|
| 8,512,463 | B2 * | 8/2013 | Hang | 106/286.4 |
| 8,771,554 | B2 * | 7/2014 | Rajendran | 252/514 |
| 2011/0308595 | A1 * | 12/2011 | Carroll et al. | 136/256 |
| 2011/0308596 | A1 * | 12/2011 | Carroll et al. | 136/256 |
| 2011/0308597 | A1 * | 12/2011 | Carroll et al. | 136/256 |

FOREIGN PATENT DOCUMENTS

| | | |
|---|---|---|
| JP | 08-097011 | 4/1996 |
| JP | 2011-171272 | 9/2011 |

* cited by examiner

*Primary Examiner* — Mark Kopec

(57) ABSTRACT

The present invention is directed to a thick film silver paste comprising (i) silver, (ii) copper, and (iii) a Pb—Te—O all dispersed in an organic medium. The present invention is further directed to an electrode formed from the paste and a semiconductor device and, in particular, a solar cell comprising such an electrode. The electrodes provide good electrical performance.

16 Claims, 1 Drawing Sheet

THICK FILM SILVER PASTE CONTAINING COPPER AND LEAD—TELLURIUM—OXIDE AND ITS USE IN THE MANUFACTURE OF SEMICONDUCTOR DEVICES

FIELD OF THE INVENTION

The present invention is directed primarily to a thick film silver paste and electrodes formed from the thick film silver paste. It is further directed to a silicon semiconductor device and, in particular, it pertains to the use of the thick film paste in the formation of an electrode of a solar cell.

TECHNICAL BACKGROUND OF THE INVENTION

A conventional solar cell structure with a p-type base has a negative electrode that is typically on the front-side or sun side of the cell and a positive electrode on the back side. Radiation of an appropriate wavelength falling on a p-n junction of a semiconductor body serves as a source of external energy to generate electron-hole pairs in that body. Because of the potential difference which exists at a p-n junction, holes and electrons move across the junction in opposite directions and thereby give rise to a flow of electric current that is capable of delivering power to an external circuit. Most solar cells are in the form of a silicon wafer that has been metallized, i.e., provided with metal electrodes that are electrically conductive. Typically thick film pastes or inks (referred to simply as "pastes" hereafter) are screen-printed onto the substrate and fired to form the electrodes.

The front or sun side of the silicon wafer is often coated with an anti-reflective coating (ARC) to prevent reflective loss of incoming sunlight, thus increasing the efficiency of the solar cell. Typically, a two-dimensional electrode grid pattern, i.e. "front electrode," makes a connection to the n-side of the silicon, and a coating of aluminum on the opposite side (back electrode) makes connection to the p-side of the silicon. These contacts are the electrical outlets from the p-n junction to the outside load.

The front electrodes of silicon solar cells are generally formed by screen-printing a paste. Typically, the paste contains electrically conductive particles, glass frit and an organic medium. After screen-printing, the wafer and paste are dried at 150° C. for a few minutes and then fired in air, typically at furnace setpoint temperatures of about 656-1000° C. for a few seconds to form a dense solid of electrically conductive traces. The organic components are burned away in this firing step. Also during this firing step, the glass frit and any added flux reacts with and etches through the anti-reflective coating and facilitates the formation of intimate silicon-electrode contact. The glass frit and any added flux also provide adhesion to the substrate and aid in the adhesion of subsequently soldered leads to the electrode. Good adhesion to the substrate and high solder adhesion of the leads to the electrode are important to the performance of the solar cell as well as the manufacturability and reliability of the solar modules.

There is an on-going effort to provide paste compositions that result in electrodes with reduced silver content while maintaining electrical performance.

SUMMARY OF THE INVENTION

The present invention provides a thick film silver paste comprising:
(a) silver;
(b) copper;
(c) Pb—Te—O; and
(d) organic medium;
wherein the silver, the copper, and the Pb—Te—O are dispersed in the organic medium.

The thick film silver paste contains 50 to 95 wt % inorganic solids, i.e., the total content of the silver, the copper and the Pb—Te—O is 50 to 95 wt %, based on the total weight of the paste.

The invention also provides a semiconductor device, and in particular, a solar cell, comprising an electrode formed from the instant thick film paste, wherein the thick film paste has been fired to remove the organic medium and form the electrode. In an embodiment the electrode is a front electrode. In another embodiment the electrode is a back electrode, e.g., a tabbing electrode.

Figure 1A:
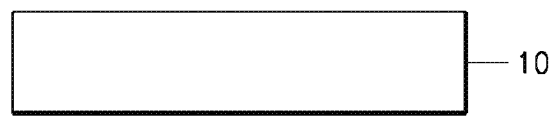
FIGS. 1A-1F illustrate the fabrication of a semiconductor device. Reference numerals shown in FIG. 1 are explained below.

10: p-type silicon substrate
20: n-type diffusion layer
30: ARC (e.g., silicon nitride film, titanium oxide film, or silicon oxide film)
40: p+ layer (back surface field, BCF)
60: aluminum paste deposited on back side
61: aluminum back side electrode (obtained by firing back side aluminum paste)
70: silver/aluminum paste deposited on back side
71: silver/aluminum back side electrode (obtained by firing back side silver/aluminum paste)
500: paste of the instant invention deposited on front side
501: front electrode (formed by firing front side paste 500)

DETAILED DESCRIPTION OF THE INVENTION

The thick film silver paste of the instant invention simultaneously provides the ability to form an electrode wherein the electrode has reduced cost because of the reduced amount of silver used but also exhibits good electrical and improved adhesion properties. The thick film silver paste can be printed or applied with the desired pattern, such as by screen-printing, plating, ink-jet printing, extrusion, shaped or multiple printing, or ribbons.

The thick film silver paste comprises silver, copper, Pb—Te—O, and an organic medium. In one embodiment, the thick film paste comprises 50-95 vol % silver and 5-50 vol % copper, wherein the vol % are based on the total volume of the silver and the copper.

The thick film silver paste of the instant invention provides electrodes with improved adhesion and reduced silver content while maintaining electrical performance.

Each constituent of the thick film silver paste of the present invention is discussed in detail below.
Silver The silver (Ag) can be in the form of silver metal, alloys of silver, or mixtures thereof. Typically, in a silver powder, the silver particles are in a flake form, a spherical form, a granular form, a crystalline form, other irregular forms and mixtures thereof. The silver can be provided in a colloidal suspension. The silver can also be in the form of silver resonates (organometallic silver), silver oxide ($Ag_2O$), silver salts such as AgCl, $AgNO_3$, $AgOOCCH_3$ (silver acetate), $AgOOCF_3$ (silver trifluoroacetate), silver orthophosphate ($Ag_3PO_4$), or mixtures thereof. Other forms of silver compatible with the other constituents can also be used.

In one embodiment, the thick film paste comprises 50-95 vol % silver, wherein the vol % is based on the total volume of the silver and the copper. In another embodiment, the thick film paste comprises 70-90 vol % silver, wherein the vol % is based on the total volume of the silver and the copper. In still another embodiment, the thick film paste comprises 50-60 vol % silver, wherein the vol % is based on the total volume of the silver and the copper.

In one embodiment, the thick film paste comprises coated silver particles that are electrically conductive. Suitable coatings include surfactants and phosphorous-containing compounds. Suitable surfactants include polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof. The salt counter-ions can be ammonium, sodium, potassium, and mixtures thereof.

The particle size of the silver is not subject to any particular limitation. In one embodiment, the average particle size is less than 15 µm; in another embodiment, the average particle size is in the range of 1 to 6 µm.

Copper

The copper (Cu) is in the form of a powder with granular particles. Typically, the average particle size is less than 15 µm. In an embodiment, the particle size distribution of the powder is such that the average particle size is between 3 and 15 µm.

In an embodiment, the copper particles are surface coated copper particles. The surface coating material may include electrically conductive materials or thermally decomposable non-conductive materials. In one such embodiment, the copper particles are fatty acid coated copper particles. Examples of suitable fatty acids include lauric acid, oleic acid, capric acid, myristic acid, linolic acid, stearic acid and mixtures thereof. In another such embodiment, the copper particles are tin-coated copper particles. In still another such embodiment, the copper particles are silver-coated copper particles.

In an embodiment, the thick film paste comprises 5-50 vol % copper, wherein the vol % is based on the total volume of the silver and the copper. In another embodiment, the thick film paste comprises 10-30 vol % copper, wherein the vol % is based on the total volume of the silver and the copper, In still another embodiment, the thick film paste comprises 40-50 vol % copper, wherein the vol % is based on the total volume of the silver and the copper.

Lead-Tellurium-Oxide

A component of the paste is a lead-tellurium-oxide (Pb—Te—O). In an embodiment, this oxide is a glass composition, e.g., a glass frit. In a further embodiment, this oxide is crystalline, partially crystalline, amorphous, partially amorphous, or combinations thereof. In an embodiment, the Pb—Te—O may include more than one glass composition. In an embodiment, the Pb—Te—O composition may include a glass composition and an additional composition, such as a crystalline composition.

The lead-tellurium-oxide (Pb—Te—O) is prepared by mixing $TeO_2$, lead oxide and other oxides to be incorporated therein (or other materials that decompose into the desired oxides when heated) using techniques understood by one of ordinary skill in the art. The lead oxide may include one or more components selected from the group consisting of PbO, $Pb_3O_4$, and $PbO_7$. Such preparation techniques may involve heating the mixture in air or an oxygen-containing atmosphere to form a melt, quenching the melt, and grinding, milling, and/or screening the quenched material to provide a powder with the desired particle size. Melting the mixture of lead, tellurium and other oxides to be incorporated therein is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $d_{50}$ of 0.1 to 3.0 microns. One skilled in the art of producing glass frit may employ alternative synthesis techniques such as but not limited to water quenching, sol-gel, spray pyrolysis, or others appropriate for making powder forms of glass.

The oxide product of the above process is typically essentially an amorphous (non-crystalline) solid material, i.e., a glass. However, in some embodiments the resulting oxide is amorphous, partially amorphous, partially crystalline, crystalline or combinations thereof. As used herein "glass frit" includes all such products.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form. As recognized by one of ordinary skill in the art in glass chemistry, a certain portion of volatile species is released during the process of making the glass. An example of a volatile species is oxygen. It should also be recognized that while the glass behaves as an amorphous material it will likely contain minor portions of a crystalline material.

If starting with a fired glass, one of ordinary skill in the art may calculate the percentages of starting components described herein using methods known to one of skill in the art including, but not limited to: Inductively Coupled Plasma-Mass Spectroscopy (ICP-MS), Inductively Coupled Plasma-Atomic Emission Spectroscopy (ICP-AES), and the like. In addition, the following exemplary technique is used: X-Ray Fluorescence spectroscopy (XRF); Nuclear Magnetic Resonance spectroscopy (NMR); Electron Paramagnetic Resonance spectroscopy (EPR); Mössbauer spectroscopy; electron microprobe Energy Dispersive Spectroscopy (EDS); electron microprobe Wavelength Dispersive Spectroscopy (WDS); or Cathodo-Luminescence (CL).

One of ordinary skill in the art would recognize that the choice of raw materials could unintentionally include impurities that are incorporated into the glass during processing. For example, the impurities is present in the range of hundreds to thousands ppm. The presence of the impurities would not alter the properties of the glass, the composition, e.g. a thick film composition, or the fired device. For example, a solar cell containing a thick film composition may have the efficiency described herein, even if the thick film composition includes impurities.

Typically, the mixture of PbO and $TeO_2$ powders used to make the Pb—Te—O includes 5 to 95 mol % of lead oxide and 5 to 95 mol % of tellurium oxide, based on the combined powders. In one embodiment, the mixture of PbO and $TeO_2$ powders includes 25 to 85 mol % of lead oxide and 15 to 75 mol % of tellurium oxide, based on the combined powders. In another embodiment, the mixture of PbO and $TeO_2$ powders includes 25 to 65 mol % of lead oxide and 35 to 75 mol % of tellurium oxide, based on the combined powders.

In one embodiment, the electrically conductive paste comprises 0.5-10 wt % Pb—Te—O, wherein the wt % is based on the total weight of the thick film paste. In another embodiment, the thick film paste comprises 0.5-5 wt % Pb—Te—O, wherein the wt % is based on the total weight of the composition.

In some embodiments, the mixture of PbO and $TeO_2$ powders further includes one or more other metal compounds. Suitable other metal compounds include $TiO_2$, $LiO_2$, $B_2O_3$, $PbF_2$, $SiO_2$, $Na_2O$, $K_2O$, $Rb_2O$, $Cs_2O$, $Al_2O_3$, MgO, CaO, SrO, BaO, $V_2O_5$, $ZrO_2$, $MoO_3$, $Mn_2O_3$, $Ag_2O$, ZnO, $Ga_2O_3$, $GeO_2$, $In_2O_3$, $SnO_2$, $Sb_2O_3$, $Bi_2O_3$, $BiF_3$, $P_2O_5$, CuO, NiO, $Cr_2O_3$, $Fe_2O_3$, CoO, $Co_2O_3$, and $CeO_2$.

Table 1 lists some examples of powder mixtures containing PbO, $TeO_2$ and other optional metal compounds that can be used to make lead-tellurium oxides. This list is meant to be illustrative, not limiting. In Table 1, the amounts of the compounds are shown as wt %, based on the weight of the total glass composition.

Therefore as used herein, the term "Pb—Te—O" also includes metal oxides that contain oxides of one or more elements selected from the group consisting of Si, Sn, Li, Ti, B, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, Ta, V, Fe, Hf, Cr, Cd, Sb, F, Zr, Mn, P, Cu, Ce, and Nb.

TABLE 1

| Powder mixture | Wt % PbO | Wt % $TeO_2$ | Wt % $PbF_2$ | Wt % $SiO_2$ | Wt % $B_2O_3$ | Wt % $P_2O_5$ | Wt % $SnO_2$ | Wt % $Ag_2O$ | Wt % $Li_2O$ |
|---|---|---|---|---|---|---|---|---|---|
| A | 32.95 | 67.05 | | | | | | | |
| B | 38.23 | 51.26 | 10.50 | | | | | | |
| C | 67.72 | 32.28 | | | | | | | |
| D | 72.20 | 27.80 | | | | | | | |
| E | 80.75 | 19.25 | | | | | | | |
| F | 59.89 | 9.30 | 16.19 | 14.82 | | | | | |
| G | 75.86 | 9.26 | | 14.88 | | | | | |
| H | 48.06 | 51.55 | | | | 0.39 | | | |
| I | 48.16 | 51.65 | | | 0.19 | | | | |
| J | 47.44 | 50.88 | | 1.68 | | | | | |
| K | 47.85 | 51.33 | | 0.82 | | | | | |
| L | 41.76 | 44.80 | | 0.32 | | | 0.80 | | 12.32 |
| M | 46.71 | 50.10 | | | | | | | 3.19 |
| N | 46.41 | 49.78 | | | | | | | 3.80 |
| O | 45.11 | 48.39 | | | | | | | 6.50 |
| P | 44.53 | 47.76 | | | | | | | 7.71 |
| Q | 48.05 | 51.54 | | | | | | 0.41 | |
| R | 47.85 | 51.33 | | | | | | 0.82 | |
| S | 47.26 | 50.70 | | | | | | 2.04 | |
| T | 45.82 | 49.19 | | | | | | | |
| U | 48.04 | 51.53 | | | | | | | |
| V | 39.53 | 28.26 | | | | | | | |
| W | 48.04 | 51.53 | | | | | | | 0.42 |

In one embodiment, the Pb—Te—O includes boron, i.e., the Pb—Te—O is Pb—Te—B—O. The starting mixture used to make the Pb—Te—B—O includes (based on the weight of the total starting mixture) PbO that is 25 to 75 wt %, 30 to 60 wt %, or 30 to 50 wt %; $TeO_2$ that is 10 to 70 wt %, 25 to 60 wt %, or 40 to 60 wt %; $B_2O_3$ that is 0.1 to 15 wt %, 0.25 to 5 wt %, or 0.4 to 2 wt %.

In an embodiment, PbO, $TeO_2$, and $B_2O_3$ are 80-100 wt % of the Pb—Te—B—O composition. In a further embodiment, PbO, $TeO_2$, and $B_2O_3$ are 85-100 wt % or 90-100 wt % of the Pb—Te—B—O composition.

In a further embodiment, in addition to the above PbO, $TeO_2$, and $B_2O_3$, the starting mixture used to make the Pb—Te—B—O includes one or more of $PbF_2$, $SiO_2$, $BiF_3$, $SnO_2$, $Li_2O$, $Bi_2O_3$, ZnO, $V_2O_5$, $Na_2O$, $TiO_2$, $Al_2O_3$, CuO, $ZrO_2$, $CeO_2$, or $Ag_2O$. In an embodiment, one or more of these components are 0.1-20 wt %, 0.1-15 wt %, or 0.1-10 wt % of the Pb—Te—B—O composition. In aspects of this embodiment (based on the weight of the total starting mixture):

the $PbF_2$ is 0.1 to 20 wt %, 0.1 to 15 wt %, or 5 to 10 wt %;
the $SiO_2$ is 0.1 to 11 wt %, 0.1 to 5 wt %, 0.25 to 4 wt %, or 0.1 to 0.5 wt %;
the $BiF_3$ is 0.1 to 15 wt %, 0.1 to 10 wt %, or 1 to 10 wt %;
the $SnO_2$ is 0.1 to 5 wt %, 0.1 to 2 wt %, or 0.5 to 1.5 wt %;
the ZnO is 0.1 to 5 wt %, 0.1 to 3 wt %, or 2 to 3 wt %;
the $V_2O_5$ is 0.1 to 5 wt %, 0.1 to 1 wt %, or 0.5 to 1 wt %;
the $Na_2O$ is 0.1 to 5 wt %, 0.1 to 3 wt %, or 0.1 to 1.5 wt %;
the CuO is 0.1 to 5 wt %, 0.1 to 3 wt %, or 2 to 3 wt %;
the $ZrO_2$ is 0.1 to 3 wt %, 0.1 to 2 wt %, or 0.1 to 1 wt %;
the $CeO_2$ is 0.1 to 5 wt %, 0.1 to 3 wt %, or 0.1 to 2.5 wt %;
the $Li_2O$ is 0.1 to 5 wt %, 0.1 to 3 wt %, or 0.25 to 2 wt %;
the $Bi_2O_3$ is 0.1 to 15 wt %, 0.1 to 10 wt %, or 5 to 8 wt %;
the $TiO_2$ is 0.1 to 5 wt %, 0.25 to 5 wt %, or 0.25 to 2.5 wt %;
the $Al_2O_3$ is 0.1 to 3 wt %, 0.1 to 2.5 wt %, or 0.1 to 2 wt %; and
the $Ag_2O$ is 0.1 to 10 wt %, 1 to 10 wt %, or 1 to 8 wt %.

In an embodiment, the Pb—Te—B—O is a homogenous powder. In a further embodiment, the Pb—Te—B—O is a combination of more than one powder, wherein each powder may separately be a homogenous population. The composition of the overall combination of the multiple powders is within the ranges described above. For example, the Pb—Te—B—O may include a combination of two or more different powders; separately, these powders may have different compositions, and may or may not be within the ranges described above; however, the combination of these powders is within the ranges described above.

In an embodiment, the Pb—Te—B—O composition may include one powder which includes a homogenous powder including some but not all of the elements of the group Pb, Te, B, and O, and a second powder, which includes one or more of the elements of the group Pb, Te, B, and O. For example, the Pb—Te—B—O composition may include a first powder including Pb, Te, and O, and a second powder including $B_2O_3$. In an aspect of this embodiment, the powders is melted together to form a uniform composition. In a further aspect of this embodiment, the powder is added separately to a thick film composition.

In an embodiment, some or all of the $Li_2O$ is replaced with $Na_2O$, $K_2O$, $Cs_2O$, or $Rb_2O$, resulting in a glass composition with properties similar to the compositions listed above. In this embodiment, the total alkali metal oxide content is 0.1 to 5 wt %, 0.1 to 3 wt %, or 0.25 to 3 wt %.

In a further embodiment, the Pb—Te—B—O composition(s) herein may include one or more of a third set of components: $GeO_2$, $Ga_2O_3$, $In_2O_3$, NiO, CoO, ZnO, CaO, MgO, SrO, MnO, BaO, $SeO_2$, $MoO_3$, $WO_3$, $Y_2O_3$, $As_2O_3$, $La_2O_3$, $Nd_2O_3$, $Bi_2O_3$, $Ta_2O_5$, $V_2O_5$, FeO, $HfO_2$, $Cr_2O_3$, CdO, $Sb_2O_3$, $PbF_2$, $ZrO_2$, $Mn_2O_3$, $P_2O_5$, CuO, $Pr_2O_3$, $Gd_2O_3$, $Sm_2O_3$, $Dy_2O_3$, $Eu_2O_3$, $Ho_2O_3$, $Yb_2O_3$, $Lu_2O_3$, $CeO_2$, $BiF_3$, SnO, $SiO_2$, $Ag_2O$, $Nb_2O_5$, $TiO_2$, $Rb_2O$, $SiO_2$, $Na_2O$, $K_2O$, $Cs_2O$, $Lu_2O_3$, $SnO_2$, and metal halides (e.g., NaCl, KBr, NaI, LiF, $ZnF_2$).

Therefore as used herein, the term "Pb—Te—B—O" may also include metal oxides that contain one or more oxides of elements selected from the group consisting of Si, Sn, Li, Ti, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, Ta, V, Fe, Hf, Cr, Cd, Sb, F, Zr, Mn, P, Cu, Ce, and Nb.

In another embodiment, the Pb—Te—O includes lithium, i.e., the Pb—Te—O is Pb—Te—Li—O. The starting mixture used to make the Pb—Te—Li—O includes (based on the weight of the total starting mixture):
PbO that is 30 to 60 wt %, 40 to 55 wt %, or 45 to 50 wt %;

TeO$_2$ that is 40 to 65 wt %, 45 to 60 wt %, or 50 to 55 wt %; and

Li$_2$O that is 0.1 to 5 wt %, 0.2 to 3 wt %, or 0.3 to 1 wt %.

In a further embodiment, in addition to the above PbO, TeO$_2$, and Li$_2$O, the starting mixture used to make the Pb—Te—Li—O includes one or more of SiO$_2$, SnO$_2$, B$_2$O$_3$, Ag$_2$O, BiF$_3$, V$_2$O$_5$, Na$_2$O, ZrO$_2$, TiO$_2$, CeO$_2$, Bi$_2$O$_3$, Nb$_2$O$_5$, Ta$_2$O$_5$, K$_2$O, MgO, P$_2$O$_5$, SeO$_2$, Co$_3$O$_4$, PdO, RuO$_2$, NiO, ZnO, CuO, MnO, Cr$_2$O$_3$, or Al$_2$O$_3$. In aspects of this embodiment (based on the weight of the total starting mixture):

the SiO$_2$ is 0.1 to 11 wt %. 0.1 to 5 wt %, 0.25 to 4 wt %, or 0.1 to 0.5 wt %;
the SnO$_2$ is 0.1 to 5 wt %, 0.1 to 2 wt %, or 0.5 to 1.5 wt %;
the B$_2$O$_3$ is 0.1 to 10 wt %, 0.1 to 5 wt %, or 0.5 to 5 wt %;
the Ag$_2$O is 0.1 to 30 wt %, 0.1 to 20 wt %, 3 to 15 wt % or 1 to 8 wt %;
the TiO$_2$ is 0.1 to 5 wt %, 0.25 to 5 wt %, or 0.25 to 2.5 wt %;
the PbF$_2$ is 0.1 to 20 wt %, 0.1 to 15 wt %, or 5 to 10 wt %;
the BiF$_3$ is 0.1 to 15 wt %, 0.1 to 10 wt %, or 1 to 10 wt %;
the ZnO is 0.1 to 5 wt %, 0.1 to 3 wt %, or 2 to 3 wt %;
the V$_2$O$_5$ is 0.1 to 5 wt %, 0.1 to 1 wt %, or 0.5 to 1 wt %;
the Na$_2$O is 0.1 to 5 wt %, 0.1 to 3 wt %, or 0.1 to 1.5 wt %;
the CuO is 0.1 to 5 wt %, 0.1 to 3 wt %, or 2 to 3 wt %;
the ZrO$_2$ is 0.1 to 3 wt %, 0.1 to 2 wt %, or 0.1 to 1 wt %;
the CeO$_2$ is 0.1 to 5 wt %, 0.1 to 3 wt %, or 0.1 to 2.5 wt %;
the B$_2$O$_3$ is 0.1 to 15 wt %, 0.1 to 10 wt %, or 5 to 8 wt %; and
the Al$_2$O$_3$ is 0.1 to 3 wt %, 0.1 to 2.5 wt %, or 0.1 to 2 wt %.

In one such embodiment, in addition to the above PbO, TeO$_2$, and Li$_2$O, the starting mixture used to make the Pb—Te—Li—O includes B$_2$O$_3$ and B$_2$O$_3$, BiF$_3$, or a mixture of Bi$_2$O$_3$ and BiF$_3$. In this embodiment, the Pb—Te—Li—O is Pb—Te—Li—B—Bi—O.

In an embodiment, the Pb—Te—Li—O is a homogenous powder. In a further embodiment, the Pb—Te—Li—O is a combination of more than one powder, wherein each powder may separately be a homogenous population. The composition of the overall combination of the two powders is within the ranges described above. For example, the Pb—Te—Li—O may include a combination of two or more different powders; separately, these powders may have different compositions, and may or may not be within the ranges described above; however, the combination of these powders is within the ranges described above.

In an embodiment, the Pb—Te—Li—O composition may include one powder which includes a homogenous powder including some but not all of the elements of the group Pb, Te, Li, and O, and a second powder, which includes one or more of the elements of the group Pb, Te, Li, and O.

In an embodiment, some or all of the Li$_2$O is replaced with Na$_2$O, K$_2$O, Cs$_2$O, or Rb$_2$O, resulting in a glass composition with properties similar to the compositions listed above. In this embodiment, the total alkali metal oxide content is 0.1 to 5 wt %, 0.1 to 3 wt %, or 0.25 to 3 wt %.

In a further embodiment, the glass frit composition(s) herein includes one or more of a third set of components: GeO$_2$, Ga$_2$O$_3$, In$_2$O$_3$, NiO, CoO, ZnO, CaO, MgO, SrO, MnO, BaO, SeO$_2$, MoO$_3$, WO$_3$, Y$_2$O$_3$, As$_2$O$_3$, La$_2$O$_3$, Nd$_2$O$_3$, Bi$_2$O$_3$, B$_2$O$_3$, Ta$_2$O$_5$, V$_2$O$_5$, FeO, HfO$_2$, Cr$_2$O$_3$, CdO, Sb$_2$O$_3$, PbF$_2$, ZrO$_2$, Mn$_2$O$_3$, P$_2$O$_5$, CuO, La$_2$O$_3$, Gd$_2$O$_3$, Sm$_2$O$_3$, Dy$_2$O$_3$, Eu$_2$O$_3$, Ho$_2$O$_3$, Yb$_2$O$_3$, Lu$_2$O$_3$, CeO$_2$, BiF$_3$, SnO, SiO$_2$, Ag$_2$O, Nb$_2$O$_5$, TiO$_2$, and metal halides (e.g., NaCl, KBr, NaI, LiF).

Therefore as used herein, the term "Pb—Te—Li—O" includes metal oxides that contain one or more elements selected from the group consisting of Si, Sn, Ti, Ag, Na, K, Rb, Cs, Ge, Ga, In, Ni, Zn, Ca, Mg, Sr, Ba, Se, Mo, W, Y, As, La, Nd, Co, Pr, Gd, Sm, Dy, Eu, Ho, Yb, Lu, Bi, B, Ta, V, Fe, Hf, Cr, Cd, Sb, F, Zr, Mn, P, Cu, Ce, and Nb.

Table 2 lists some examples of powder mixtures containing PbO, TeO$_2$, Li$_2$O that can be used to make lead-tellurium-lithium-oxides. This list is meant to be illustrative, not limiting. In Table 2, the amounts of the compounds are shown as wt %, based on the weight of the total glass composition.

TABLE 2

| Glass # | PbO | Li$_2$O | TeO$_2$ |
|---|---|---|---|
| 1 | 48.04 | 0.42 | 51.54 |
| 2 | 47.74 | 1.05 | 51.21 |
| 3 | 44.73 | 0.43 | 54.84 |
| 4 | 55.49 | 0.41 | 44.09 |
| 5 | 58.07 | 0.41 | 41.52 |
| 6 | 34.51 | 2.44 | 63.06 |
| 7 | 42.77 | 0.43 | 56.80 |
| 8 | 45.82 | 4.99 | 49.19 |
| 9 | 48.04 | 0.42 | 51.53 |
| 10 | 47.82 | 0.89 | 51.29 |
| 11 | 42.77 | 0.43 | 56.80 |
| 12 | 37.31 | 0.44 | 62.25 |
| 13 | 57.80 | 0.86 | 41.33 |
| 14 | 58.07 | 0.41 | 41.52 |

In still another embodiment, the Pb—Te—O includes lithium and titanium, i.e., the Pb—Te—O is Pb—Te—Li—Ti—O. The starting mixture used to make the Pb—Te—Li—Ti—O includes, based on the total weight of the starting mixture of the Pb—Te—Li—Ti—O, 25-65 wt % PbO, 25-70 wt % TeO$_2$, 0.1-5 wt % Li$_2$O and 0.1-5 wt % TiO$_2$. In one embodiment, the starting mixture used to make the Pb—Te—Li—Ti—O includes, based on the total weight of the starting mixture of the Pb—Te—Li—Ti—O, 30-60 wt % PbO, 30-65 wt % TeO$_2$, 0.25-3 wt % Li$_2$O and 0.25-5 wt % TiO$_2$. In another embodiment, the starting mixture includes 30-50 wt % PbO, 50-65 wt % TeO$_2$, 0.5-2.5 wt % Li$_2$O and 0.5-3 wt % TiO$_2$.

In any of the above embodiments, PbO, TeO$_2$, Li$_2$O$_3$, and TiO$_2$ is 80-100 wt % of the Pb—Te—Li—Ti—O composition. In further embodiments, PbO, TeO$_2$, Li$_2$O$_3$, and TiO$_2$ is 85-100 wt % or 90-100 wt % of the Pb—Te—Li—Ti—O composition.

In other embodiments, in addition to the above PbO, TeO$_2$, Li$_2$O, and TiO$_2$, the Pb—Te—Li—Ti—O further comprises an oxide selected from the group consisting of SiO$_2$, SnO$_2$, B$_2$O$_3$, ZnO, Nb$_2$O$_5$, CeO$_2$, V$_2$O$_5$, Al$_2$O$_3$, Ag$_2$O and mixtures thereof. In aspects of this embodiment (based on the weight of the total starting mixture):

the SiO$_2$ is 0.1 to 10 wt %, 0.1 to 9 wt %, or 2 to 9 wt %;
the SnO$_2$ is 0.1 to 5 wt %, 0.1 to 4 wt %, or 0.5 to 1.5 wt %;
the B$_2$O$_3$ is 0.1 to 10 wt %, 0.1 to 5 wt %, or 1 to 5 wt %; and
the Ag$_2$O is 0.1 to 30 wt %, 0.1 to 20 wt %, or 3 to 15 wt %.

In addition, in any of the above embodiments, the glass frit composition herein may include one or more of a third set of components: GeO$_2$, Ga$_2$O$_3$, In$_2$O$_3$, MO, ZnO, CaO, MgO, SrO, BaO, SeO$_2$, MoO$_3$, WO$_3$, Y$_2$O$_3$, As$_2$O$_3$, La$_2$O$_3$, Nd$_2$O$_3$, Bi$_2$O$_3$, BiF$_3$, Ta$_2$O$_5$, FeO, HfO$_2$, Cr$_2$O$_3$, CdO, Sb$_2$O$_3$, PbF$_2$, ZrO$_2$, Mn$_2$O$_3$, P$_2$O$_5$, CuO, Nb$_2$O$_5$, Rb$_2$O, Na$_2$O, K$_2$O, Cs$_2$O, Lu$_2$O$_3$, and metal halides (e.g., NaCl, KBr, NaI, LiF, ZnF$_2$).

Therefore as used herein, the term "Pb—Te—Li—Ti—O" also includes oxides containing oxides of one or more elements selected from the group consisting of Si, Sn, B, Ag, Na, K, Rb, Cs, Ge, Ga, In, Ni, Zn, Ca, Mg, Sr, Ba, Se, Mo, W, Y, As, La, Nd, Bi, Ta, V, Fe, Hf, Cr, Cd, Sb, Zr, Mn, P, Cu, Lu, Ce, Al and Nb.

Tables 3 and 4 list some examples of powder mixtures containing PbO, TeO$_2$, and other optional compounds that can be used to make lead-tellurium-lithium-titanium-oxides. This list is meant to be illustrative, not limiting. In Tables 3 and 4, the amounts of the compounds are shown as weight percent, based on the weight of the total Pb—Te—Li—Ti—O composition.

The lead-tellurium-lithium-titanium-oxide (Pb—Te—Li—Ti—O) compositions of Table 3 were prepared by mixing and blending amounts of Pb$_3$O$_4$, TeO$_2$, Li$_2$CO$_3$, and TiO$_2$ powders, and optionally, as shown in Table 3, SiO$_2$, B$_2$O$_3$, Ag$_2$O, and/or SnO$_2$ to provide compositions of the oxides with the weight percentages shown in Table 3, based on the weight of the total glass composition.

TABLE 3

| Frit | SiO$_2$ | PbO | B$_2$O$_3$ | Li$_2$O | TiO$_2$ | Ag$_2$O | SnO$_2$ | TeO$_2$ |
|---|---|---|---|---|---|---|---|---|
| 1 | 8.40 | 60.90 |  | 1.47 | 0.93 |  | 0.70 | 27.60 |
| 2 |  | 46.04 |  | 0.40 | 4.18 |  |  | 49.38 |
| 3 |  | 46.78 |  | 0.83 | 2.22 |  |  | 50.17 |
| 4 |  | 47.43 |  | 0.85 | 0.84 |  |  | 50.88 |
| 5 |  | 33.77 |  | 2.39 | 2.13 |  |  | 61.71 |
| 6 |  | 45.35 |  | 0.48 | 0.43 |  |  | 53.74 |
| 7 |  | 36.19 |  | 1.99 | 1.77 |  |  | 60.05 |
| 8 |  | 37.35 |  | 2.39 | 2.13 |  |  | 58.13 |
| 9 |  | 36.19 |  | 1.82 | 3.06 |  |  | 58.94 |
| 10 |  | 40.81 |  | 2.39 | 2.13 |  |  | 54.67 |
| 11 |  | 44.28 |  | 0.16 | 0.42 | 12.29 |  | 42.84 |
| 12 |  | 40.81 |  | 0.59 | 1.57 | 9.08 |  | 47.95 |
| 13 |  | 40.81 |  | 1.90 | 1.12 |  |  | 56.16 |
| 14 |  | 45.77 | 1.09 | 0.80 | 0.71 |  |  | 51.64 |
| 15 |  | 41.20 |  | 0.34 | 2.30 |  |  | 56.16 |
| 16 |  | 44.31 | 0.52 | 0.46 | 0.96 | 3.57 |  | 50.17 |
| 17 |  | 42.92 | 0.54 | 0.78 | 1.31 |  |  | 54.44 |
| 18 |  | 42.22 |  | 0.91 | 1.53 |  |  | 55.35 |

The lead-tellurium-lithium-titanium-oxide (Pb—Te—Li—Ti—O) compositions of Table 4 were prepared by mixing and blending amounts of Pb$_3$O$_4$, TeO$_2$, Li$_2$CO$_3$ and TiO$_2$ powders, and optionally, as shown in Table 4, B$_2$O$_3$, ZnO, Nb$_2$O$_5$, CeO$_2$, and/or V$_2$O$_5$ to provide compositions of the oxides with the weight percentages shown in Table 4, based on the weight of the total glass composition.

TABLE 4

| Frit | PbO | B$_2$O$_3$ | ZnO | Nb$_2$O$_5$ | Li$_2$O | TiO$_2$ | CeO$_2$ | V$_2$O$_5$ | TeO2 |
|---|---|---|---|---|---|---|---|---|---|
| 19 | 42.27 |  |  |  | 0.94 | 1.51 |  | 2.87 | 52.40 |
| 20 | 42.57 |  |  | 4.13 | 0.92 | 1.54 |  |  | 50.85 |
| 21 | 45.26 | 0.86 | 2.25 |  | 0.55 | 0.49 | 1.06 |  | 49.53 |

In one embodiment, the Pb—Te—Li—Ti—O is a homogenous powder. In a further embodiment, the Pb—Te—Li—Ti—O is a combination of more than one powder, wherein each powder may separately be a homogenous population. The composition of the overall combination of the 2 powders is within the ranges described above. For example, the Pb—Te—Li—Ti—O may include a combination of 2 or more different powders; separately, these powders may have different compositions, and may or may not be within the ranges described above; however, the combination of these powders is within the ranges described above.

In an embodiment, the Pb—Te—Li—Ti—O composition may include one powder which includes a homogenous powder including some but not all of the desired elements of the Pb—Te—Li—Ti—O composition, and a second powder, which includes one or more of the other desired elements. For example, a Pb—Te—Li—Ti—O composition may include a first powder including Pb, Te, Li, and O, and a second powder including TO$_2$. In an aspect of this embodiment, the powders is melted together to form a uniform composition. In a further aspect of this embodiment, the powder is added separately to a thick film composition.

In an embodiment, some or all of any Li$_2$O is replaced with Na$_2$O, K$_2$O, Cs$_2$O, or Rb$_2$O, resulting in a glass composition with properties similar to the compositions listed above. In this embodiment, the total alkali metal content will be that described above for Li$_2$O.

Organic Medium

The inorganic components of the paste are mixed with an organic medium to form viscous thick film pastes or less viscous inks having suitable consistency and rheology for printing. A wide variety of inert viscous materials can be used as the organic medium. The organic medium can be one in which the inorganic components are dispersible with an adequate degree of stability during manufacturing, shipping and storage of the pastes or inks, as well as on the printing screen during a screen-printing process.

Suitable organic media have rheological properties that provide stable dispersion of solids, appropriate viscosity and thixotropy for printing, appropriate wettability of the substrate and the paste solids, a good drying rate, and good firing properties. The organic medium can contain thickeners, stabilizers, surfactants, and/or other common additives. One such thixotropic thickener is Thixatrol® (Elementis plc, London, UK). The organic medium can be a solution of polymer(s) in solvent(s). Suitable polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include: bis(2-(2-butoxyethoxy)ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin. The organic medium can also comprise volatile liquids to promote rapid hardening after application of the paste composition on a substrate.

The optimal amount of organic medium in the paste is dependent on the method of applying the composition, the specific organic medium used and the purpose for which the paste is being used. The paste contains 5 to 50 wt % of organic medium, based on the total weight of the composition.

If the organic medium comprises a polymer, the polymer typically comprises 8 to 15 wt % of the organic composition.

Preparation of the Paste

In one embodiment, the paste can be prepared by mixing the silver, the copper, the Pb—Te—O, and the organic medium in any order. In some embodiments, the inorganic materials are mixed first, and they are then added to the organic medium. In other embodiments, the silver, which is the major portion of the inorganics, is slowly added to the organic medium. The viscosity can be adjusted, if needed, by the addition of solvents. Mixing methods that provide high shear are useful.

Formation of Electrodes

The paste can be deposited, for example, by screen-printing, plating, extrusion, ink-jet printing, shaped or multiple printing, or ribbons.

In this electrode-forming process, the paste is first dried and then heated to remove the organic medium and sinter the inorganic materials. The heating can be carried out in air or an oxygen-containing atmosphere. This step is commonly referred to as "firing." The firing temperature profile is typically set so as to enable the burnout of organic binder materials from the dried paste composition, as well as any other organic materials present. In one embodiment, the firing temperature is 700 to 950° C. The firing can be conducted in a belt furnace using high transport rates, for example, 100-500 cm/min, with resulting hold-up times of 0.03 to 5 minutes. Multiple temperature zones, for example 3 to 11 zones, can be used to control the desired thermal profile.

In one embodiment, a semiconductor device is manufactured from an article comprising a junction-bearing semiconductor substrate and a silicon nitride insulating film formed on a main surface thereof. The instant paste is applied (e.g., coated or screen-printed) onto the insulating film, in a predetermined shape and thickness and at a predetermined position. The instant paste has the ability to penetrate the insulating layer. Firing is then carried out and the paste reacts with the insulating film and penetrates the insulating film, thereby effecting electrical contact with the silicon substrate and as a result the electrode is formed.

An example of this method of forming the electrode is described below in conjunction with FIGS. 1A-1F.

FIG. 1A shows a single crystal or multi-crystalline p-type silicon substrate 10.

Figure 1B:
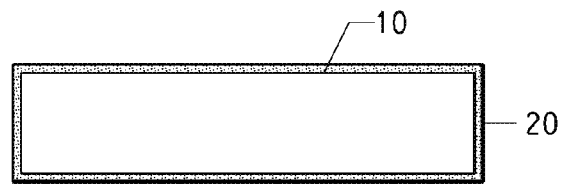

In FIG. 1B, an n-type diffusion layer 20 of the reverse conductivity type is formed by the thermal diffusion of phosphorus using phosphorus oxychloride as the phosphorus source. In the absence of any particular modifications, the diffusion layer 20 is formed over the entire surface of the silicon p-type substrate 10. The depth of the diffusion layer can be varied by controlling the diffusion temperature and time, and is generally formed in a thickness range of about 0.3 to 0.5 microns. The n-type diffusion layer may have a sheet resistivity of several tens of ohms per square up to about 120 ohms per square.

Figure 1C:
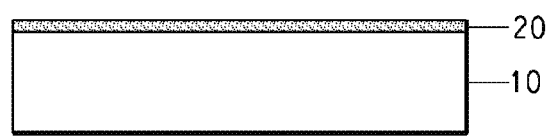

After protecting the front surface of this diffusion layer with a resist or the like, as shown in FIG. 1C the diffusion layer 20 is removed from the rest of the surfaces by etching so that it remains only on the front surface. The resist is then removed using an organic solvent or the like.

Figure 1D:
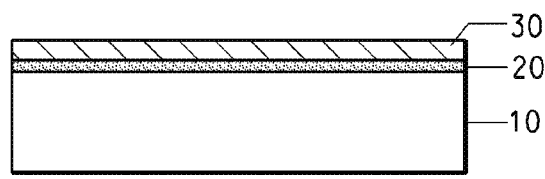

Then, as shown in FIG. 1D an insulating layer 30 which also functions as an anti-reflection coating (ARC) is formed on the n-type diffusion layer 20. The insulating layer is commonly silicon nitride, but can also be a $SiN_x$:H film (i.e., the insulating film comprises hydrogen for passivation during subsequent firing processing), a titanium oxide film, a silicon oxide film, or a silicon oxide/titanium oxide film. A thickness of about 700 to 900 Å of a silicon nitride film is suitable for a refractive index of about 1.9 to 2.0. Deposition of the insulating layer 30 can be by sputtering, chemical vapor deposition, or other methods.

Figure 1E:
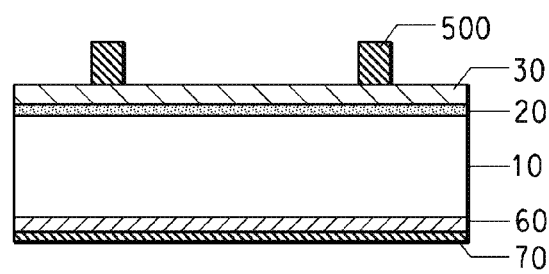

Next, electrodes are formed. As shown in FIG. 1E, the thick film paste of the present invention 500 is screen-printed to create the front electrode on the insulating film 30 and then dried. In addition, a back side silver or silver/aluminum paste 70, and an aluminum paste 60 are then screen-printed onto the back side of the substrate and successively dried. Firing is carried out in an infrared belt furnace at a temperature range of approximately 750 to 950° C. for a period of from several seconds to several tens of minutes.

Figure 1F:
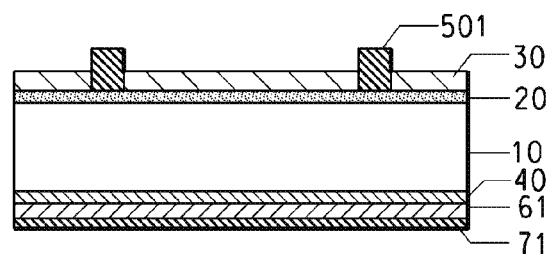

Consequently, as shown in FIG. 1F, during firing, aluminum diffuses from the aluminum paste 60 into the silicon substrate 10 on the back side thereby forming a p+ layer 40 containing a high concentration of aluminum dopant. This layer is generally called the back surface field (BSF) layer, and helps to improve the energy conversion efficiency of the solar cell.

Firing converts the dried aluminum paste 60 to an aluminum back electrode 61. The back side silver or silver/aluminum paste 70 is fired at the same time, becoming a silver or silver/aluminum back electrode, 71. During firing, the boundary between the back side aluminum and the back side silver or silver/aluminum assumes the state of an alloy, thereby achieving electrical connection. Most areas of the back electrode are occupied by the aluminum electrode 61, owing in part to the need to form a p+ layer 40. Because soldering to an aluminum electrode is impossible, the silver or silver/aluminum back electrode 71 is formed over portions of the back side as an electrode for interconnecting solar cells by means of copper ribbon or the like. In addition, the front side thick film paste 500 of the present invention sinters and penetrates through the insulating film 30 during firing, and thereby achieves electrical contact with the n-type layer 20. This type of process is generally called "fire through." The fired electrode 501 of FIG. 1F clearly shows the result of the fire through.

EXAMPLES

Solar Cell Electrical Measurements

A commercial Current-Voltage (JV) tester ST-1 000 (Telecom-STV Ltd., Moscow, Russia) was used to make efficiency and fill factor measurements of the polycrystalline silicon photovoltaic cells. Two electrical connections, one for voltage and one for current, were made on the top and the bottom of each of the photovoltaic cells. Transient photo-excitation was used to avoid heating the silicon photovoltaic cells and to obtain JV curves under standard temperature conditions (25° C.). A flash lamp with a spectral output similar to the solar spectrum illuminated the photovoltaic cells from a vertical distance of 1 m. The lamp power was held constant for 14 milliseconds. The intensity at the sample surface, as calibrated against external solar cells was 1000 W/m² (or 1 sun) during this time period. During the 14 milliseconds, the JV tester varied an artificial electrical load on the sample from short circuit to open circuit. The JV tester recorded the light-induced current through, and the voltage across, the photovoltaic cells while the load changed over the stated range of loads. A power versus voltage curve was obtained from this data by taking the product of the current times the voltage at each voltage level. The maximum of the power versus voltage curve was taken as the characteristic output power of the solar cell for calculating solar cell efficiency. This maximum power was divided by the area of the sample to obtain the maximum power density at 1 Sun intensity. This was then divided by 1000 W/m² of the input intensity to obtain the efficiency which is then multiplied by 100 to present the result in percent efficiency. Other parameters of interest were also obtained from this same current-voltage curve. One such parameter is fill factor (FF) which is obtained by taking the ratio of the maximum power from the solar cell to the product of open circuit voltage and short circuit current. The FF is defined as the ratio of the maximum power from the solar cell to the product of $V_{oc}$ and $I_{sc}$, multiplied by 100.

Comparative Experiment A

One batch of thick film paste was made by mixing 86.01 g silver, 2.01 g Pb—Te—Li—O and 9.41 g organic medium in a plastic jar using a THINKY® ARE-310 mixer (THINKY Corp., Laguna Hills, Calif.) for 1 min at 2000 rpm. This step was repeated two more times until a thoroughly mixed blend was obtained. The dispersed mixture was then blended with triple roll mill (Charles Ross & Son Company, Floor Model, 4"×8") at a 1 mil gap for three passes at zero psi and three passes at 100 psi to obtain a thick paste. The viscosity of the final paste was measured using a Brookfield HADV-1 Prime Viscometer (Brookfield Engineering Labs, Inc., Middleboro, Mass.) with the thermostatted small-sample adapter at about 10 rpm and was found to be 288 Pas. The solid content of the final paste was calculated to be about 90.3 wt %.

The Pb—Te—Li—O was prepared as follows. Mixtures of $TeO_2$ powder (99+% purity), PbO powder (ACS reagent grade, 99+% purity) and $Li_2CO_3$ in the % cation ratio Te:Pb:Li of 57:38:5 were tumbled in a polyethylene container for 30 min to mix the starting powders. The starting powder mixture was placed in a platinum crucible and heated in air at a heating rate of 10° C./min to 900° C. and then held at 900° C. for one h to melt the mixture. The melt was quenched from 900° C. by removing the platinum crucible from the furnace and pouring the melt onto a stainless steel platen. The resulting material was ground in a mortar and pestle to less than 100 mesh. The ground material was then ball-milled in a polyethylene container with zirconia balls and isopropyl alcohol until the average particle size ($d_{50}$) was 0.5-0.7 microns. The ball-milled material was then separated from the milling balls, dried, and run through a 100 mesh screen to provide the $PbO$—$TeO_2$—$Li_2O$ powder (Pb—Te—Li—O) used in the thick film paste preparations.

The organic medium components of the thick film paste and the quantities used are given in Table 5. The organic medium was prepared by mixing the components.

TABLE 5

| Component | Wt. (g) |
| --- | --- |
| Ethyl Cellulose (50-52% ethoxy) | 1.30 |
| Ethyl Cellulose (48-50% ethoxyl) | 0.51 |
| Duomeen ®, an amine oleate surfactant | 1.09 |
| Foralyn ™ (hydrogenated rosin ester) | 2.51 |
| Thixatrol ® ST, hydrogenated castor oil | 0.50 |
| DBE-3 (dibasic ester-3) | 3.50 |

The resulting paste was used in Comparative Experiment A. The paste was printed on the front side of a 28 mm×28 mm multicrystalline silicon wafer 200 μm thick to form a front side electrode and then dried. A commercially available aluminum paste PV381 (DuPont Co., Wilmington, Del.) was screen printed on the back side of the silicon wafer to form the back side electrode and then dried. Essentially identical additional wafers were prepared in a similar fashion. These wafers were fired at four different maximum firing temperatures ranging from 910 to 955° C. to form the front and back side electrodes of the solar cell. At least three to five wafers were fired at each of the temperatures. The median solar cell efficiency and the fill factor (FF), measured as described above, are shown in Table 6 for the samples prepared at each of the maximum firing temperatures. Since the paste made and used in this Comparative Experiment contained Ag but no copper, it is designated as having a composition of 100 vol % Ag, based on the total volume of Ag and copper.

Example 1

A second batch of thick film paste was made essentially as described in Comparative Experiment A, except that the amount of Ag, i.e., the volume of Ag, was replaced with a mixture of Ag and copper in which 75% of that volume was Ag and 25% was fatty acid coated copper. The fatty acid coated copper contained a 0.1% fatty acid coating on copper with a median particle size $d_{50}$ of 3.3 μm (lot #7032-2 obtained from CuLox Technologies, Inc., Naugatuck, Conn.). This paste is designated as having a composition of 75 vol % Ag/25 vol % fatty acid coated copper (Cu), based on the total volume of Ag and copper. Solar cells were made and measurements obtained as described in Comparative Experiment A. The median solar cell efficiency and the fill factor, measured as described above, are shown in Table 6 for the samples prepared at each of the maximum firing temperatures.

Example 2

A third batch of thick film paste was made essentially as described in Comparative Experiment A, except that the amount of Ag, i.e., the volume of Ag, was replaced with a mixture of Ag and copper in which 75% of that volume was Ag and 25% was tin (Sn) coated copper in which the tin comprised 1.25 vol %. The tin coated copper had a median particle size $d_{50}$ of 13 μm (lot #3205-2 obtained from Technic, Inc., Cranston, R.I.). This paste is designated as having a composition of 75 vol % Ag/25 vol % Sn coated copper, based on the total volume of Ag and Cu. Solar cells were made and measurements obtained as described in Comparative Experiment A. The median solar cell efficiency and the fill factor, measured as described above, are shown in Table 6 for the samples prepared at each of the maximum firing temperatures.

Example 3

A forth batch of thick film paste was made essentially as described in Comparative Experiment A, except that the amount of Ag, i.e., the volume of Ag, was replaced with a mixture of Ag and copper in which 75% of that volume was Ag and 25% was copper. The copper had a median particle size $d_{50}$ of 4.3 μm (lot #56109150802 obtained from ACuPowder International, LLC, Union, N.J.). This paste is designated as having a composition of 75 vol % Ag/25 vol % Cu, based on the total volume of Ag and Cu. Solar cells were made and measurements obtained as described in Comparative Experiment A. The median solar cell efficiency and the fill factor, measured as described above, are shown in Table 6 for the samples prepared at each of the maximum firing temperatures.

TABLE 6

| Paste Composition | Maximum Firing Temp. | Efficiency (%) | FF (%) |
| --- | --- | --- | --- |
| 100 vol % Ag | 910° C. | 15.16 | 77.7 |
| (Comparative | 925° C. | 14.56 | 76.3 |
| Experiment A) | 940° C. | 15.47 | 77.4 |
|  | 955° C. | 15.25 | 76.5 |
| 75 vol % Ag/ | 910° C. | 11.43 | 59.5 |
| 25 vol % (fatty | 925° C. | 14.72 | 75.1 |
| acid coated) Cu | 940° C. | 14.88 | 76.6 |
| (Example 1) | 955° C. | 14.29 | 74.9 |
| 75 vol % Ag/ | 910° C. | 10.87 | 55.4 |
| 25 vol % (Sn | 925° C. | 13.10 | 67.3 |
| coated) Cu | 940° C. | 14.52 | 74.0 |
| (Example 2) | 955° C. | 15.0 | 77.5 |
| 75 vol % Ag/ | 910° C. | 10.98 | 57.3 |
| 25 vol % Cu | 925° C. | 12.23 | 63.55 |
| (Example 3) | 940° C. | 13.71 | 72.85 |
|  | 955° C. | 13.70 | 73.30 |

What is claimed is:

1. A thick film silver paste comprising:
   (a) silver;
   (b) copper;
   (c) Pb—Te—O; and
   (d) organic medium;
   said thick film silver paste comprising 65-95 vol % silver and 5-35 vol % copper, wherein said vol % are based on the total volume of said silver and said copper and wherein said silver, said copper, and said Pb—Te—O are dispersed in said organic medium.

2. The thick film silver paste of claim 1, wherein the total content of said silver, said copper and said Pb—Te—O is 50 to 95 wt %, based on the total weight of said thick film silver paste.

3. The thick film silver paste of claim 1, wherein said copper is surface coated copper selected from the group consisting of fatty acid coated copper, tin coated copper, silver coated copper and mixtures thereof.

4. The thick film silver paste of claim 1, said thick film silver paste comprising 0.5-10 wt % Pb—Te—O, wherein said wt % is based on the total weight of said thick film silver paste.

5. The thick film silver paste of claim 4, wherein said Pb—Te—O is a Pb—Te—Li—O.

6. The thick film silver paste of claim 4, wherein said Pb—Te—O is a Pb—Te—Li—Ti—O.

7. The thick film silver paste of claim 4, wherein said Pb—Te—O is a Pb—Te—Li—B—Bi—O.

8. The thick film silver paste of claim 4, said thick film silver paste comprising 0.5-5 wt % Pb—Te—O wherein said wt % is based on the total weight of said thick film silver paste.

9. A solar cell comprising an electrode formed from the thick film silver paste of claim 1.

10. The solar cell of claim 9, wherein the total content of said silver, said copper and said Pb—Te—O is 50 to 95 wt %, based on the total weight of said thick film silver paste.

11. The solar cell of claim 9, wherein said copper is surface coated copper selected from the group consisting of fatty acid coated copper, tin coated copper, silver coated copper and mixtures thereof.

12. The solar cell of claim 9, said thick film silver paste comprising 0.5-10 wt % Pb—Te—O, wherein said wt % is based on the total weight of said thick film silver paste.

13. The solar cell of claim 12, wherein said Pb—Te—O is a Pb—Te—Li—O.

14. The solar cell of claim 12, wherein said Pb—Te—O is a Pb—Te—Li—Ti—O.

15. The solar cell of claim 12, wherein said Pb—Te—O is a Pb—Te—Li—B—Bi—O.

16. The solar cell of claim 9, wherein said copper is surface coated copper and said Pb—Te—O is a Pb—Te—Li—O.

* * * * *